US008038898B2

(12) United States Patent
Uchida et al.

(10) Patent No.: US 8,038,898 B2
(45) Date of Patent: Oct. 18, 2011

(54) ABRASIVE LIQUID FOR METAL AND METHOD FOR POLISHING

(75) Inventors: Takeshi Uchida, Tsukuba (JP); Jun Matsuzawa, Hitachi (JP); Tetsuya Hoshino, Tsukuba (JP); Yasuo Kamigata, Tsukuba (JP); Hiroki Terazaki, Tsukuba (JP); Yoshio Honma, Kokubunji (JP); Seiichi Kondoh, Kokubunji (JP)

(73) Assignees: Hitachi Chemical Company, Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 10/995,494

(22) Filed: Nov. 24, 2004

(65) Prior Publication Data

US 2005/0095860 A1 May 5, 2005

Related U.S. Application Data

(63) Continuation of application No. 09/976,001, filed on Oct. 15, 2001, now Pat. No. 6,899,821, which is a continuation of application No. 09/763,891, filed as application No. PCT/JP99/04694 on Aug. 31, 1999, now Pat. No. 6,896,825.

(30) Foreign Application Priority Data

Aug. 31, 1998 (JP) .................................. 10-245616
Dec. 10, 1998 (JP) .................................. 10-351188

(51) Int. Cl.
    *H01L 21/302* (2006.01)
(52) U.S. Cl. .......... 216/88; 438/692; 438/633; 438/645; 438/687
(58) Field of Classification Search .................. 252/79.1, 252/79.4; 438/692
    See application file for complete search history.

(56) References Cited

U.S. PATENT DOCUMENTS

| 3,559,570 | A | * | 2/1971 | Martel et al. ................ 430/49.1 |
| 4,051,057 | A | | 9/1977 | Ericson et al. |
| 4,098,720 | A | * | 7/1978 | Hwa .......................... 252/389.3 |
| 4,190,516 | A | * | 2/1980 | Kajimaya et al. .......... 204/290.01 |
| 4,537,654 | A | | 8/1985 | Berenz et al. |
| 4,954,142 | A | | 9/1990 | Carr et al. |
| 4,956,015 | A | * | 9/1990 | Okajima et al. ................ 106/3 |
| 4,968,381 | A | | 11/1990 | Prigge et al. |
| 5,084,071 | A | | 1/1992 | Nenadic et al. |
| 5,434,107 | A | | 7/1995 | Paranjpe |
| 5,575,885 | A | | 11/1996 | Hirabayashi et al. |
| 5,607,718 | A | | 3/1997 | Sasaki et al. |
| 5,691,219 | A | | 11/1997 | Kawakubo et al. |
| 5,733,819 | A | | 3/1998 | Kodama et al. |
| 5,770,095 | A | | 6/1998 | Sasaki et al. |
| 5,770,103 | A | | 6/1998 | Wang et al. |
| 5,835,176 | A | * | 11/1998 | Jeong et al. ...................... 349/124 |
| 5,860,848 | A | * | 1/1999 | Loncki et al. ..................... 451/36 |
| 5,876,490 | A | | 3/1999 | Ronay |
| 5,932,486 | A | | 8/1999 | Cook et al. |
| 5,954,997 | A | | 9/1999 | Kaufman et al. |
| 5,958,794 | A | * | 9/1999 | Bruxvoort et al. ............ 438/692 |
| 5,981,394 | A | | 11/1999 | Ohashi et al. |
| 6,013,323 | A | * | 1/2000 | Klayder et al. ............... 427/384 |
| 6,117,783 | A | | 9/2000 | Small et al. |
| 6,194,317 | B1 | * | 2/2001 | Kaisaki et al. ................ 438/692 |
| 6,206,756 | B1 | | 3/2001 | Chopra et al. |
| 6,276,996 | B1 | * | 8/2001 | Chopra ........................... 451/41 |
| 6,313,039 | B1 | | 11/2001 | Small et al. |
| 6,316,366 | B1 | * | 11/2001 | Kaufman et al. ............. 438/693 |
| 6,326,299 | B1 | * | 12/2001 | Homma et al. ............... 438/633 |
| 6,561,883 | B1 | * | 5/2003 | Kondo et al. .................. 451/63 |
| 6,607,424 | B1 | * | 8/2003 | Costas et al. .................... 451/41 |

FOREIGN PATENT DOCUMENTS

| EP | 0 845 512 | 6/1998 |
| EP | 0 846 742 | 6/1998 |
| JP | 63-272460 | 11/1988 |
| JP | 2-278822 | 11/1990 |
| JP | 6-88258 | 3/1994 |
| JP | 07-193034 | 7/1995 |
| JP | 7-233485 | 9/1995 |
| JP | 07-233485 | 9/1995 |
| JP | 08-083780 | 3/1996 |
| JP | 8-83780 | 3/1996 |
| JP | 9-55363 | 2/1997 |
| JP | 09-184081 | 7/1997 |
| JP | 10-044047 | 2/1998 |
| JP | 10-163141 | 6/1998 |
| JP | 10-168431 | 6/1998 |
| JP | 11-195628 | 7/1999 |
| JP | 2000-49124 | 2/2000 |
| JP | 2000-049124 | 2/2000 |

(Continued)

OTHER PUBLICATIONS

Yoshida et al., Cerium Oxide Abrasive and Method for Polishing Substrate, Jun. 19, 1998, English Abstract of JP 410152673 A), 2 pages.*

Pipe Ind Inst [Piper], Chemical polishing soln. for copper and its alloys—contg. inorganic acids, surface-active agent, water-soluble polymer and water, Oct. 27, 1976, English Abstract of SU 514912 A, a page.*

Communication dated Aug. 5, 2004, for corresponding European Patent Application No. 99940570.7-1214-JP9904694; and Supplementary Partial European Search Report Enclosed therewith.

(Continued)

*Primary Examiner* — Anita Alanko
(74) *Attorney, Agent, or Firm* — Antonelli, Terry, Stout & Kraus, LLP.

(57) ABSTRACT

An abrasive liquid for a metal comprising (1) an oxidizing agent for a metal, (2) a dissolving agent for an oxidized metal, (3) a first protecting film-forming agent such as an amino acid or an azole which adsorbs physically on the surface of the metal and/or forms a chemical bond, to thereby form a protecting film, (4) a second protecting film-forming agent such as polyacrylic acid, polyamido acid or a salt thereof which assists the first protecting film-forming agent in forming a protecting film and (5) water; and a method for polishing.

15 Claims, No Drawings

FOREIGN PATENT DOCUMENTS

| | | |
|---|---|---|
| JP | 2000-501771 | 2/2000 |
| JP | 2000-133621 | 5/2000 |
| JP | 2000-150435 | 5/2000 |
| JP | 2003-535452 | 11/2003 |
| KR | 2001-0053167 | 6/2001 |
| WO | WO 98/04646 | 2/1998 |
| WO | WO 98/26025 | 6/1998 |
| WO | WO 98/49723 | 11/1998 |
| WO | WO 00/00561 | 1/2000 |
| WO | WO 00/28586 | 5/2000 |

OTHER PUBLICATIONS

Office Action dated Jun. 10, 2004, For corresponding Canadian Application No. 2,342,332.

Written Opinion from the Australian Patent Office for Application No. SG 200200664-1. mailed Aug. 23, 2004.

Y. Hayashi et al., "A New Abrasive-Free, Chemical-Mechanical-Polishing for Aluminum Metallization of ULSI Devices", International Electron Devices Meeting Technical Digest, 1992, pp. 976-978.

Luo et al., Chemical-Mechanical Polishing of Copper in Acidic Media, Feb. 22-23, 1996, CMP-MIC Conference 1996 ISMIC—100P/96/0145, pp. 145-151.

Official Action, for Japanese Application No. 2001-371089, dated Aug. 29, 2006.

Official Action issued in Japanese Patent Application No. 2004-356961 on Apr. 14, 2009.

Official Action issued in Japanese Patent Application No. 2004-356962 on Apr. 14, 2009.

European Official Action dated Feb. 22, 2010, for Application No. EP 99 940 570.7.

Japanese Official Action issued Jul. 7, 2009, for Application No. 2004-356961.

Japanese Official Action issued Jul. 21, 2009, for Application No. 2007-038626.

Japanese Official Action issued Aug. 18, 2009, for Application No. 2007-038631.

Extended European Search Report, including European Search Report and European Search Opinion, dated Sep. 21, 2010, for European Application No. 10168136.9-1217.

* cited by examiner

ABRASIVE LIQUID FOR METAL AND METHOD FOR POLISHING

This application is a Continuation application of application Ser. No. 09/976,001, filed Oct. 15, 2001, now U.S. Pat. No. 6,899,821, which is a Continuation application of application Ser. No. 09/763,891, filed Jun. 11, 2001, now U.S. Pat. No. 6,896,825, the contents of which are incorporated herein by reference in their entirety. No. 09/763,891 is a National Stage application filed under 35 USC §371 of International (PCT) Application No. PCT/JP99/04694, filed Aug. 31, 1999.

TECHNICAL FIELD

This invention relates to a polishing solution for metal, and a polishing method, especially suited for use in polishing in the step of forming wirings of semiconductor devices.

BACKGROUND ART

In recent years, with the trend toward higher integration and higher performance of semiconductor integrated circuits (hereinafter "LSI circuits"), new fine-processing techniques are on development. Chemical mechanical polishing (hereinafter "CMP") is one of them, which is a technique frequently used in LSI circuit fabrication steps, in particular, in the planarizing of interlayer insulating films, the formation of metal plugs and the formation of buried wiring, in the step of forming multi-layer wiring. This technique is disclosed in, e.g., U.S. Pat. No. 4,944,836.

Recently, aiming at higher performance of LSI circuits, it is also attempted to use copper alloys as a wiring material. The copper alloys, however, make it difficult to perform the fine processing by dry etching that has frequently been used in the formation of conventional aluminum alloy wiring. Accordingly, what is called damascene process is employed in which copper or its alloy thin film is deposited on an insulating film having grooves which are formed previously, the film standing buried in the grooves, and the copper alloy thin film other than that on the grooves are removed by CMP to form buried wiring. This technique is disclosed, e.g., in Japanese Patent Application Laid-open No. 2-278822.

In a common method for CMP of metals, a polishing pad is stuck onto a circular polishing surface plate (platen), the surface of the polishing pad is soaked with a polishing slurry for metal, the surface of a substrate on which a metal film has been formed is pressed against the pad surface, the polishing platen is rotated in the state a preset pressure (hereinafter "polishing pressure") is applied from its back side, and hills of the metal film are removed by mechanical friction between the polishing slurry and the hills of the metal film.

Polishing slurries for metal which are used in CMP are commonly comprised of an oxidizing agent and solid abrasive particle or powder and also an oxidized-metal dissolving agent and a protective-film forming agent which are optionally further added. What is considered to be basic mechanism is that the metal film surface is first oxidized by oxidation and the oxide layer thus formed is scraped off by the solid abrasive grains. The oxide layer at valleys of the metal surface does not so much come in touch with the polishing pad, and the effect of scrape-off by solid abrasive grains does not extend thereto, so that with progress of CMP, hills of the metal layer are removed and the metal member surface become smooth. Details of the matter are disclosed in Journal of Electrochemical Society, Vol. 138, No. 11 (published 1991), pages 3460-3464.

It is considered that the effect of scrape-off by solid abrasive grains is enhanced as long as the grains of a metal oxide scraped off by the solid abrasive grains have been dissolved in the polishing slurry by the aid of the oxidized-metal dissolving agent. If, however, the oxide layer at valleys of the metal film surface is also dissolved (hereinafter "etched") until the metal film surface becomes uncovered, the metal film surface is further oxidized by the oxidizing agent. If this is repeated, the oxide layer at valleys may unwantedly be etched further, resulting in a loss of the effect of smoothing. There is such a possibility. In order to prevent it, a protective-film forming agent is further added. It is important to well balance the effects attributable to the oxidized-metal dissolving agent and protective-film forming agent, and it is desired that the oxide layer of the metal film surface is not so much etched, that the grains of the oxide layer scraped off are dissolved in a good efficiency and that the polishing by CMP is at a high rate.

Thus, adding such oxidized-metal dissolving agent and protective-film forming agent so as to add an effect of chemical reaction brings about an improvement in CMP rate (i.e., polishing rate attributable to CMP), and also can provide the effect of less damaging the metal film surface subjected to the CMP.

However, when the buried wiring is formed by CMP using the conventional polishing slurry for metal, containing solid abrasive grains, there are problems such that (1) a phenomenon may take place in which the middle portion of the surface of buried metal wiring is isotropically corroded to become hollow like a dish (hereinafter "dishing"), (2) polishing mars (scratches) due to the solid abrasive grains may occur, (3) a complicated cleaning process is required for removing any solid abrasive grains remaining on the substrate surface after polishing, and (4) the initial cost of the solid abrasive grains themselves and the disposal of waste liquid brings about a high cost.

In order to keep the dishing from occurring and the copper alloy from being corroded during polishing and to form highly reliable LSI wiring, a method making use of a polishing solution for metal which contains an oxidized-metal dissolving agent comprised of aminoacetic acid (glycine) or amidosulfuric acid and benzotriazole (hereinafter "BTA") is proposed. This technique is disclosed in, e.g., Japanese Patent Application Laid-open No. 8-83780.

The BTA, however, has so high a protective-film forming effect that it may cause a great decrease in not only etching rate but also polishing rate. Hence, it is demanded to use in the polishing solution for metal a protective-film forming agent that does not cause any decrease in CMP rate.

DISCLOSURE OF THE INVENTION

The present invention provides a polishing solution for metal, and a polishing method, which can make the etching rate sufficiently low, and can form highly reliable metal film buried patterns while maintaining a high CMP rate.

The polishing solution for metal of the present invention comprises an oxidizing agent for oxidizing a metal, an oxidized-metal dissolving agent, a first protective-film forming agent, a second protective-film forming agent different from the first protective-film forming agent, and water.

The protective-film forming agents are agents capable of forming protective films on the metal surface.

The first protective-film forming agent may preferably be at least one selected from nitrogen containing compounds such as ammonia, alkylamines, amino acids, imines and azoles, and salts thereof, mercaptans, glucose, and cellulose. These protective-film forming agents are compounds capable of forming protective films by forming physical adsorption and/or chemical linkage on the metal film surface.

The second protective-film forming agent may preferably be at least one selected from alcohols (i.e., compounds having an alcoholic hydroxyl group), phenols (i.e., compounds having a phenolic hydroxyl group), esters, ethers, polysaccharides, amino acid salts, polycarboxylic acids and salts thereof, vinyl polymers, sulfonic acid and salts thereof, aromatic amines, amides, azo compounds, and molybdenum compounds. These second protective-film forming agents are compounds which assist the first protective-film forming agent in forming the protective film.

The oxidizing agent may preferably be at least one selected from hydrogen peroxide, nitric acid, potassium periodate, hypochlorous acid and ozone water.

The oxidized-metal dissolving agent may preferably be at least one selected from organic acids and ammonium salts thereof, and sulfuric acid.

In the present invention, a polishing solution for metal is provided in which, based on a concentration A of the first protective-film forming agent added which is necessary for exhibiting the effect of controlling the etching rate to 10 nm/minute or lower without incorporating the second protective-film forming agent among the protective-film forming agents, the second protective-film forming agent is added in a concentration lower than the concentration A so that the effect of controlling the etching rate to 10 nm/minute or lower can be exhibited. More specifically, in this case, the second protective-film forming agent is a compound which enables the first protective-film forming agent, necessary for controlling the etching rate to 10 nm/minute or lower, to be added in a smaller quantity.

The polishing method of the present invention is a polishing method of polishing a metal film formed on the surface of a polishing object, in the polishing solution for metal according to the present invention to remove the metal film. As the metal film to be removed, suited are copper, copper alloys, copper oxides, copper alloy oxides and so forth. Accordingly, the present invention provides a polishing method comprising the step of polishing a metal film comprised of a multi-layer film containing at least one layer of a metal selected from copper, a copper alloy, a cooper oxide and a copper alloy oxide, to remove at least part of the metal film.

The present invention provides a polishing solution in which the first and second protective-film forming agents having properties different from each other are used in combination so as to make the etching rate sufficiently low while maintaining the CMP rate, and a polishing method making use of such a polishing solution. As the first protective-film forming agent, usable are those capable of readily producing a chelate complex with copper, e.g., ethylenediaminetetraacetic acid, benzotriazole or the like. These have a very strong effect of forming a metal surface protective-film. For example, its incorporation in the polishing solution for metal in an amount of 0.5% by weight or more makes no CMP take place, to say nothing of etching.

On the other hand, the present inventors have discovered that the use of the first protective-film forming agent in combination with a second protective-film forming agent different from the former enables the etching rate to be sufficiently low even when the first protective-film forming agent is added in a low concentration. Moreover, it has been found that the use of such a polishing solution can provide preferable properties that the CMP rate does not so much decrease even when the etching rate decreases. In addition, they have discovered that the use of the first protective-film forming agent in combination with the second protective-film forming agent makes it possible to carry out polishing at a practical CMP rate even without adding any solid abrasive grains in the polishing solution. This is presumed to be due to the scrape-off attributable to the friction by the polishing pad, effected in place of the effect of the scrape-off attributable to the friction by solid abrasive grains in conventional cases.

As a value at which the etching rate is to be controlled, it has been found that a preferable smoothing effect is obtainable as long as it is controlled to 10 nm/minute or lower. As long as the decrease in CMP rate is within a tolerable range, it is preferable for the etching rate to be much lower. Where the etching rate can be controlled to 5 nm/minute or lower, the dishing can be kept at a level not problematic, even when the CMP is carried out in excess by, e.g., about 50% (the CMP is carried out about 1.5 times the time necessary for removing the metal film by CMP). Where the etching rate can further be controlled to 1 nm/minute or lower, the dishing dose not come into question even when the CMP is carried out in excess by 100% or more.

Incidentally, in the present specification, the etching rate refers to a rate at which a metal film (copper film formed by sputtering) on the surface of a polishing object is etched when the polishing object is immersed in the polishing solution and the polishing solution is stirred at a liquid temperature of 25° C. and at a stirring speed of 100 rpm, where a difference in thickness of the metal film before and after immersion is calculated from the value of electrical resistance and the difference found is divided by immersion time to determine the rate.

The CMP rate (i.e., chemical mechanical polishing rate) also refers to a rate obtained when a metal film (copper film formed by sputtering) on the surface of a polishing object is polished under conditions of a polishing pressure of 210 g/cm$^2$, a polishing object/polishing platen relative speed of 36 m/minute and a liquid temperature of 25° C., where a difference in thickness of the metal film before and after polishing is calculated from the value of electrical resistance and the difference found is divided by treatment time to determine the rate.

According to the present invention, as being different from a polishing solution making use of only the first protective-film forming agent, and without relying on any strong mechanical friction by solid abrasive grains, the surface can be smoothed by CMP by the action of friction with a polishing pad, which is much softer than the solid abrasive grains.

The present invention further provides a polishing method of polishing a substrate by the use of the polishing solution for metal according to the present invention; the substrate having valleys at its surface, and a metal film comprised of copper, a copper alloy (such as copper/chromium) or the like being formed thereon, filling the grooves with the film. Where such a substrate is subjected to CMP by the use of the polishing solution of the present invention, the metal film at hills of the substrate is selectively removed by CMP and the metal film remains in valleys, thus the desired conductor pattern is obtained. The polishing solution of the present invention substantially need not contain any solid abrasive grains, and hence polish scratches can dramatically be lessened because the CMP proceeds by the friction with a polishing pad, which is mechanically much softer than the solid abrasive grains.

The polishing solution for metal according to the present invention has as essential components the oxidizing agent, the oxidized-metal dissolving agent, the first protective-film forming agent, the second protective-film forming agent, and water.

The solid abrasive grains substantially need not be contained, but may also be used.

The respective components contained in the polishing solution for metal according to the present invention are specifically described below.

The metal-oxidizing agent may include hydrogen peroxide ($H_2O_2$), nitric acid, potassium periodate, hypochlorous acid, ozone water, and the like. In the case when the substrate is a silicon substrate having devices for integrated circuits, any contamination due to alkali metals, alkaline earth metals or halides is not desirable, and hence oxidizing agents containing no nonvolatile component are preferred. Ozone water may greatly cause a compositional change with time. Accordingly, among the oxidizing agents listed above, hydrogen peroxide is most preferred. However, oxidizing agents containing a nonvolatile component may be used when the substrate is a glass substrate having no semiconductor devices.

The oxidized-metal dissolving agent may preferably be water-soluble one. Such a water-soluble oxidized-metal dissolving agent may include:

organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylhexanoic acid, 4-methylpentanoic acid, n-methylhexanoic acid, n-octanoic acid, n-ethylhexanoic acid, benzoic acid, glycoric acid, salicylic acid, glyceric acid, oxalic acid, malonic acid, succinic acid, glutaric acid, adipic acid, pimelic acid, maleic acid, phthalic acid, malic acid, tartaric acid and citric acid;

ammonium salts such as ammonium salts of these organic acids, ammonium persulfate, ammonium nitrate and ammonium chloride;

inorganic acids such as sulfuric acid and chromic acid; ammonium complexes and the like. Any of these may be used alone or may be used in combination.

Of these, formic acid, malonic acid, malic acid, tartaric acid and citric acid are preferred with respect to a multi-layer film containing a metal film formed of copper, a copper alloy, a copper oxide and/or a copper alloy oxide. These acids are preferable in view of an advantage that they can be well balanced with the first protective-film forming agent and second protective-film forming agent described later. In particular, with regard to malic acid, tartaric acid and citric acid, they are preferable in view of an advantage that the etching rate can effectively be controlled maintaining a practical CMP rate.

The first protective-film forming agent may include:
ammonia;
amines such as alkylamines such as dimethylamine, trimethylamine, triethylamine and propylenediamine, ethylenediaminetetraacetic acid (hereinafter "EDTA"), sodium diethyldithiocarbamate and chitosan;
amino acids such as glycine, L-alanine, β-alanine, L-2-aminobutyricacid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cystine, L-methionine, L-ethionine, L-lanthionine, L-cystathionine, L-cysteic, L-cystinic acid, L-aspartic acid, L-glutamic acid, S-(carboxymethyl)-L-cysteine, 4-aminobutyric acid, L-asparagine, L-glutamine, azaserine, L-arginine, L-canavanine, L-citruline, δ-hydroxy-L-lysine, creatine, L-kynurenine, L-histidine, 1-methyl-L-histidine, 3-methyl-L-histidine, ergothioneine, L-tryptophan, actinomycin C1, apamine, angiotensin I, angiotensin II and antipain;

imines such as dithizone, cuproine(2,2'-biquinoline), neocuproine(2,9-dimethyl-1,10-phenanthroline), vasocuproine(2,9-dimethyl-4,7-diphenyl-1,10-phenanthroline) and cuperazone (bicyclohexanone oxalylhydrozone);

azoles such as benzimidazole-2-thiol, 2-[2-(benzothiazolyl)]thiopropionic acid, 2-[2-(benzothiazolyl)]thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydoxybenzotriazole, 4-carboxyl-1H-benzotriazole, 4-methoxycarbonyl-1H-benzotriazole, 4-butoxycarbonyl-1H-benzotriazole, 4-octyloxycarbonyl-1H-benzotriazole, 5-hexylbenzotriazole, N-(1,2,3-benzotriazolyl-1-methyl)-N-(1,2,4-triazolyl-methyl)2-ethylhexylamine, tolyltriazole, naphthotriazole and bis[(1-benzotriazolyl)methyl]phosphonic acid;

mercaptans such as nonylmercaptan, dodecylmercaptan, triazinethiol, triazinedithiol and triazinetrithiol; and saccharides such as glucose and cellulose. Any of these may be used alone or may be used in appropriate combination.

Of these, chitosan, ethylenediaminetetraacetic acid, L-tryptophan, cuperazone, triazinedithiol, bonzotriazole, 4-hydroxybonzotriazole, 4-carboxyl-1H-benzotriazole butyl ester, tolyltriazole and naphthotriazole are preferred in order to achieve botha high CMP rate and a low etching rate. In particular, benzotriazole and derivatives thereof are preferred. Benzotriazole derivatives may include the azoles listed above.

The second protective-film forming agent may include;
alcohols such as 1-propanol, 2-propanol, 2-propin-1-ol, allyl alcohol, ethylene cyanohydrin, 1-butanol, 2-butanol, (S)-(+)-2-butanol, 2-methyl-1-propanol, t-butyl alcohol, perfluoro-t-butyl alcohol, crotyl alcohol, 1-pentanol, 2,2-dimethyl-1-propanol, 2-methyl-2-butanol, 3-methyl-1-butanol, S-amyl alcohol, 1-hexanol, 4-hydroxy-4-methyl-2-pentanone, 4-methyl-2-pentanol, cyclohexanol, DL-3-hexyl alcohol, 1-heptanol, 2-ethylhexyl alcohol, (S)-(+)-2-octanol, 1-octanol, DL-3-octyl alcohol, 2-hydroxybenzyl alcohol, 2-nitrobenzyl alcohol, 3,5-dihydroxybenzyl alcohol, 3,5-dinitrobenzyl alcohol, 3-fluorobenzyl alcohol, 3-hydroxybenzyl alcohol, 4-fluorobenzyl alcohol, 4-hydroxybenzyl alcohol, benzyl alcohol, m-(trifluoromethyl)benzyl alcohol, m-aminobenzyl alcohol, m-nitrobenzyl alcohol, o-aminobenzyl alcohol, o-hydroxybenzyl alcohol, p-hydroxybenzyl alcohol, p-nitrobenzyl alcohol, 2-(p-fluorophenyl) ethanol, 2-aminophenethyl alcohol, 2-methoxybenzyl alcohol, 2-methyl-3-nitrobenzyl alcohol, 2-methylbenzyl alcohol, 2-nitrophenethyl alcohol, 2-phenyl ethanol, 3,4-dimethylbenzyl alcohol, 3-methyl-2-nitrobenzyl alcohol, 3-methyl-4-nitrobenzyl alcohol, 3-methylbenzyl alcohol, 4-fluorophenethyl alcohol, 4-hydroxy-3-methoxybenzyl alcohol, 4-methoxybenzyl alcohol, 4-methyl-3-nitrobenzyl alcohol, 5-methyl-2-nitrobenzyl alcohol, DL-α-hydroxyethylbenzene, o-(trifluoromethyl)benzyl alcohol, p-(trifluoromethyl)benzyl alcohol, p-aminophenethyl alcohol, p-hydroxyphenyl ethanol, p-methylbenzyl alcohol and S-phenethyl alcohol;

phenols such as 4-methylphenol, 4-ethylphenol and 4-propylphenol;

esters such as glycerol ester, sorbitan ester, methoxyaceticacid, ethoxyaceticacid, 3-ethoxypropionic acid and alanine ethyl ester;

ethers such as polyethylene glycol, polypropylene glycol, polytetramethylene glycol, polyethylene glycol alkyl ethers, polyethylene glycol alkenyl ethers, alkyl polyethylene glycols, alkyl polyethylene glycol alkyl ethers, alkyl polyethylene glycol alkenyl ethers, alkenyl polyethylene glycols, alkenyl polyethylene glycol alkyl ethers, alkenyl polyethylene glycol alkenyl ethers, polypropylene glycol alkyl ethers, polypropylene glycol alkenyl ethers, alkyl polypropylene glycols, alkyl polypropylene glycol alkyl ethers, alkyl polypropylene glycol alkenyl ethers, alkenyl polypropylene glycols, alkenyl polypropylene glycol alkyl ethers, and alkenyl polypropylene glycol alkenyl ethers;

polysaccharides such as alginic acid, pectic acid, carboxymethyl cellulose, curdlan and pullulan;

amino acid salts such as glycine ammonium salt and glycine sodium salt;

polycarboxylic acid and salts thereof, such as polyaspartic acid, polyglutamic acid, polylysine, polymalic acid, polymethacrylic acid, ammonium polymethacrylate, sodium polymethacrylate, polyamic acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamic acid, ammonium polyamide, sodium polyamide and polyglyoxylic acid;

vinyl type polymers such as polyvinyl alcohol, polyvinyl pyrrolidone and polyacrolein;

sulfonic acids and salts thereof, such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate, sodium 3-ethoxypropyl sulfonate, sodium methoxymethyl sulfonate, ammonium ethoxymethyl sulfonate, sodium 3-ethoxypropyl sulfonate and sodium sulfosuccinate;

aromatic amines such as aniline, N,N-dimethylaniline and benzylamine; amides such as propionamide, acrylamide, methyurea, nicontinamide, succinamide, phenylacetamide, pyridine-4-carboxamide, N,N'-dibenzyl-L-tartaric acid amide and sulfanilamide;

azo compounds such as 1,1'-azobis(cyclohexane-1-carbonitrile), 1,1'-azobis(1-acetoxy-1-phenylethane), 2,2'-azobis(2,4-dimethylvaleronitrile), 2,2'-azobis(4-methoxy-2,4-dimethylvaleronitrile), dimethyl 2,2'-azobis (isobutyrate), 2,2'-azobis(isobutylonitrile), 2-[2-(3,5-dibromopyridyl)azo]-5-dimethylaminobenzoic acid, 4,4'-azobis(4-cyanovaleric acid), 4,4'-azoxyanisole, azoxymethane, azobenzene, azoxybenzene, azodicarbonamide, diisopropyl azodicarboxylate, di(t-butyl) azodicarboxylate, phenazine, Marachite Green, Methyl Orange, Congo Red and Crystal Violet; and molybdenum compounds such as disodium molybdenum (VI) dihydrate and hexaammonium heptamolybdenum (VI) tetrahydrate. Any of these may be used alone or may be used in appropriate combination.

Where the substrate used is, e.g., a silicon substrate for semiconductor integrated circuits, it is not desirable for it to be contaminated with alkali metals, alkaline earth metals, halides or the like, and hence acids or ammonium salts thereof are preferred. This, however, does not necessarily apply where the substrate is a glass substrate or the like.

Of these compounds, 2-methyl-3-nitrobenzyl alcohol, polypropylene glycol, polyaspartic acid, polymalic acid, polyacrylic acid, polymethacrylic acid, ammonium polyacrylate, ammonium polymethacrylate, polyamic acid, ammonium polyamide, polyacrylamide, methyl taurate, benzylamine, nicontinamide, sulfanilamide, Congo Red, hexaammonium heptamolybdenum (VI) tetrahydrate are preferred in order to achieve both a high CMP rate and a low etching rate. In particular, polyacrylic acid, polymethacrylic acid, polyamic acid, ammonium polyacrylate, ammonium polymethacrylate, ammonium polyamide and polyacrylamide are preferred.

As the metal film to which the present invention is applied, it is a multi-layer film containing at least one selected from copper, a copper alloy, a copper oxide and a copper alloy oxide (hereinafter generically "copper alloy").

The present invention also provides a polishing solution for metal which has a CMP rate of 100 nm/minute or higher and an etching rate of 10 nm/minute or lower. The polishing solution having such properties has been materialized for the first time by the present invention, and can be achieved by having the metal-oxidizing agent, the oxidized-metal dissolving agent and the water and further being mixed with the first protective-film forming agent in combination with the second protective-film forming agent different from the first protective-film forming agent.

Usable combinations of the first protective-film forming agent with the second protective-film forming agent are shown below in the form of first protective-film forming agent/second protective-film forming agent. These combinations are merely shown as examples, and the present invention is by no means limited to these. Other combinations may also appropriately be used.

Combinations that can achieve the CMP rate of 100 nm/minute or higher and the etching rate of 10 nm/minute or lower may include, e.g., cuperazone/polymalic acid, cuperazone/polyaspartic acid, cuperazone/polyacrylamide, L-tryptophan/polyacrylamide, L-tryptophan/ammonium polyacrylate, L-tryptophan/polymalic acid, benzotriazole/polyacrylamide, benzotriazole/ammonium polyacrylate, naphthotriazole/polymalic acid, naphthotriazole/2-methyl-3-nitrobenzyl alcohol, triazinedithiol/polyaspartic acid, and triazinedithiol/polyacrylamide.

Combinations that can achieve the CMP rate of 100 nm/minute or higher and the etching rate of 1 nm/minute or lower may include, e.g., cuperazone/polyacrylamide, L-tryptophan/polyacrylamide, L-tryptophan/ammonium polyacrylate, benzotriazole/polyacrylamide, benzotriazole/ammonium polyacrylate, naphthotriazole/polymalic acid, triazinedithiol/polyaspartic acid, and triazinedithiol/polyacrylamide.

Combinations that can achieve a CMP rate of 250 nm/minute or higher and the etching rate of 10 nm/minute or lower may include, e.g., cuperazone/polymalic acid.

The amount in which each component is mixed is described below.

The oxidizing agent component may preferably be mixed in an amount of from 0.003 mol to 0.7 mol, more preferably from 0.03 mol to 0.5 mol, and particularly preferably from 0.2 mol to 0.3 mol, based on 100 g of the total amount of the oxidizing agent, oxidized-metal dissolving agent, first protective-film forming agent, second protective-film forming agent and water. If it is mixed in an amount less than 0.003 mol, the metal may insufficiently be oxidized, resulting in a low CMP rate. If it is in an amount more than 0.7 mol, the surface polished tends to have a roughness.

The oxidized-metal dissolving agent component in the present invention may preferably be mixed in an amount of from 0 mol to 0.005 mol, more preferably from 0.00005 mol to 0.0025 mol, and particularly preferably from 0.0005 mol to 0.0015 mol, based on 100 g of the total amount of the oxidizing agent, oxidized-metal dissolving agent, first protective-film forming agent, second protective-film forming agent and water. If it is mixed in an amount more than 0.005 mol, the etching tends to be controllable with difficulty.

The first protective-film forming agent may preferably be mixed in an amount of from 0.0001 mol to 0.05 mol, more preferably from 0.0003 mol to 0.005 mol, and particularly preferably from 0.0005 mol to 0.0035 mol, based on 100 g of the total amount of the oxidizing agent, oxidized-metal dissolving agent, first protective-film forming agent, second protective-film forming agent and water. If it is mixed in an amount less than 0.0001 mol, the etching tends to be controllable with difficulty. If it is in an amount more than 0.05 mol, a low CMP rate tends to result.

The second protective-film forming agent may preferably be mixed in an amount of from 0.001% by weight to 0.3% by weight, more preferably from 0.003% by weight to 0.1% by weight, and particularly preferably from 0.01% by weight to 0.08% by weight, based on 100 g of the total amount of the oxidizing agent, oxidized-metal dissolving agent, first protective-film forming agent, second protective-film forming agent and water. If it is mixed in an amount less than 0.001% by weight, the effect of its use in combination with the first protective-film forming agent tends not to be shown in the etching control. If it is in an amount more than 0.3% by weight, a low CMP rate tends to result.

The mechanism by which the intended effect is obtained in the polishing solution and polishing method of the present invention is unclear. It is presumed that the use of the first and second protective-film forming agents in combination makes them control the etching, but makes the CMP proceed without making their films function as metal surface protective films against the friction by the polishing pad.

In general, the degree of polish scratches occurring in CMP depends on the particle diameter, particle size distribution and shape of solid abrasive grains, and any decrease in layer thickness (hereinafter called "erosion") as a result of the scrape of insulating film and any deterioration of the smoothing effect also depend on the particle diameter of solid abrasive grains and the physical properties of polishing pads. When the surface of metal film, in particular, copper film is treated with BTA, the dishing of the metal film is considered to depend on the hardness of polishing pads and the chemical properties of polishing solutions. More specifically, hard solid abrasive grains are necessary for the progress of CMP, but are not desirable for improving the smoothing effect in CMP and the perfectness (freeness from damages such as polish scratches or the like) of the surface polished by CMP. The smoothing effect is understood to actually depend more on the characteristics of polishing pads than on solid abrasive grains.

Thus, the present invention is considered to be very desirable for the CMP of copper alloys and besides for the formation of buried patterns by using the same.

Incidentally, the first protective-film forming agent has the action of forming a strong protective film on the metal surface. For example, where the copper alloy film surface is exposed to a solution containing BTA, it is considered that a film of polymeric complex compound having as the main skeleton a structure of Cu (I) BTA or Cu (II) BTA is formed as a result of the reaction of copper (Cu) or an oxide thereof with BTA. The film thus formed is fairly so tough that, when a polishing solution for metal is used which contains 0.5% by weight of BTA, the film is usually little polished even where solid abrasive grains are contained in the polishing solution.

On the other hand, where the polishing solution for metal is prepared not using the first protective-film forming agent and using only the second protective-film forming agent alone, it is difficult especially to control the etching rate, ensuring no sufficient protective effect.

Thus, the first protective-film forming agent and the second protective-film forming agent have their action different from each other, and different type of protective films are formed in accordance with the type of protective-film forming agents. The present invention is based on a new discovery that the use of the first and second protective-film forming agents in combination enables achievement of both the controlling of etching rate and the maintaining of CMP rate, and moreover even makes it unnecessary to rely on the strong friction by solid abrasive grains.

BEST MODES FOR PRACTICING THE INVENTION

The present invention will be described below by giving Examples. The present invention is by no means limited by these Examples.

Example 1 to 12 Comparative Examples 1 to 5

Preparation of Polishing Solutions

To 0.15 part by weight of DL-malic acid (a guaranteed reagent), 70 parts by weight of water was added to make a solution. To the solution formed, a solution prepared by adding 0.2 part by weight of the first protective-film forming agent in 0.8 part by weight of methanol was added, and thereafter 0.05 part by weight of the second protective-film forming agent was further added, finally followed by addition of 33.2 parts by weight of hydrogen peroxide water (a guaranteed reagent, an aqueous 30% solution) to obtain a polishing solution for metal. Herein, protective-film forming agents used in each Example and Comparative Example are shown in Table 1.

Next, using the polishing solution thus obtained, polishing objects were polished. Polishing conditions were as follows:
-Polishing Conditions-
Polishing object substrate: A silicon substrate with a copper film formed in a thickness of 1 μm.
Polishing pad: IC1000 (available from Rodel Co.).
Polishing pressure: 210 g/cm$^2$.
Substrate/polishing platen relative speed: 36 m/min.
-Polished Article Evaluation Items-
CMP rate: A difference in layer thickness of the copper film before and after CMP was determined by calculation from the value of electrical resistance and the difference found was divided by treatment time to determined the rate. Treatment time was set to be 1 minute.

Etching rate: The same substrate as the above polishing object substrate was separately prepared, and was immersed in the polishing solution with stirring (stirring speed: 100 rpm) at room temperature (25° C.), where a difference in layer thickness of the copper film before and after immersing was calculated from the value of electrical resistance and the difference found was divided by treatment time to determined the rate. Treatment time was set to be 10 minute.

In order to evaluate actual CMP performance, grooves of 0.5 μm deep were formed in an insulating layer and a copper film was formed by known sputtering, followed by known heat treatment to obtain a film-buried silicon substrate, which was also used as a substrate to carry out CMP. Whether or not any erosion and polish scratches had occurred was examined by visual observation, optical-microscopic observation and electron microscopic observation of the substrate having been polishing by CMP. As the result, neither erosion nor polish scratch was seen to have occurred. The results of evaluation on the CMP rate and etching rate in Examples 1 to 11 and Comparative Examples 1 to 5 are shown in Table 1.

TABLE 1

| | First protective-film forming agent | Second protective-film forming agent | CMPC PS rate | Etching rate |
|---|---|---|---|---|
| Example 1 | cuperazone | polymalic acid | 281 | 3.5 |
| Example 2 | cuperazone | polyaspartic acid | 234 | 1.9 |
| Example 3 | cuperazone | polyacrylamide | 187 | 0.3 |
| Example 4 | L-tryptophan | polyacrylamide | 219 | 0.9 |
| Example 5 | L-tryptophan | ammonium polyacrylate | 210 | 0.7 |
| Example 6 | L-tryptophan | polymalic acid | 252 | 2.2 |
| Example 7 | benzotriazole | ammonium polyacrylate | 185 | 0.2 |
| Example 8 | benzotriazole | polyacrylamide | 196 | 0.4 |
| Example 9 | naphthotriazole | polymalic acid | 203 | 0.5 |
| Example 10 | naphthotriazole | 2-methyl-3-nitrobenzyl alcohol | 212 | 1.1 |
| Example 11 | triazinedithiol | polyaspartic acid | 186 | 0.4 |
| Example 12 | triazinedithiol | polyacrylamide | 224 | 1.0 |
| Comparative Example 1 | cuperazone | none | 255 | 15.3 |
| Comparative Example 2 | L-tryptophan | none | 287 | 10.3 |
| Comparative Example 3 | benzotriazole | none | 93 | 2.4 |
| Comparative Example 4 | naphthotriazole | none | 72 | 2.1 |
| Comparative Example 5 | triazinedithiol | none | 98 | 4.8 |

Example 13

To 0.15 part by weight of DL-malic acid (a guaranteed reagent), 70 parts by weight of water was added to make a solution. To the solution formed, a solution prepared by adding 0.1 part by weight of BTA in 0.8 part by weight of methanol was added, and thereafter 0.025 part by weight of ammonium polyacrylate was further added in the form of an aqueous 40% solution, finally followed by addition of 33.2 parts by weight of hydrogen peroxide water (a guaranteed reagent, an aqueous 30% solution) to obtain a polishing solution for metal. In the present Example, the DL-malicacid, an organic acid having a high solubility in water, was used as the oxidized-metal dissolving agent, and the water-soluble, ammonium polyacrylate was used as the second protective-film forming agent.

Using this polishing solution, CMP was tested under the same conditions as in Example 1. As the result, the CMP rate was 287 nm/minute and the etching rate was 3.6 nm/minute, both showing good results. However, as to the substrate having the groove pattern formed therein, when it was polished by CMP in excess by 50% beyond the CMP time necessary for removing the film by CMP in a stated thickness, the electron microscopic observation revealed that the dishing occurred in a depth of about 200 nm at grooves of 10 μm wide (the part serving as buried wiring). In order to control the dishing to a depth of 100 nm or less, it was necessary to keep the excess CMP time within 20%. Erosion and polish scratch were seen not to have occurred.

Example 14

To 0.15 part by weight of DL-malic acid (a guaranteed reagent), 70 parts by weight of water was added to make a solution. To the solution formed, a solution prepared by adding 0.2 part by weight of BTA in 0.8 part by weight of methanol was added, and thereafter 0.125 part by weight of ammonium polyacrylate was further added in the form of an aqueous 40% solution, finally followed by addition of 33.2 parts by weight of hydrogen peroxide water (a guaranteed reagent, an aqueous 30% solution) to obtain a polishing solution for metal. In the present Example, the DL-malic acid, an organic acid having a high solubility in water, was used as the oxidized-metal dissolving agent, and the water-soluble, ammonium polyacrylate was used as the second protective-film forming agent.

Using this polishing solution, CMP was tested under the same conditions as in Example 1. As the result, the CMP rate was as high as 185 nm/minute and the etching rate was as low as 0.2 nm/minute. Also, as to the substrate having the groove pattern formed therein, too, it was polished by CMP under the same conditions as the above CMP and the observation was made in the same manner as the above, where the dishing was in a depth of 50 nm or less even when the CMP was carried out in excess for the time corresponding to 50%, and neither erosion nor polish scratch was seen to have occurred.

Example 15

A polishing solution for metal was prepared in the same manner as in Example 14 except that the DL-malic acid was replaced with DL-tartaric acid. The CMP was tested in the same manner as in Example 1. As the result, the polishing rate was as high as 194 nm/minute and the etching rate was 0.8 nm/minute. Also, the same substrate having the groove pattern formed therein as that of Example 13 was polished and thereafter the substrate surface was observed, where the dishing in the case when the CMP was carried out in excess for the time corresponding to 50% was in a depth of about 70 nm, and neither erosion nor polish scratch was seen to have occurred.

Example 16

A polishing solution for metal was prepared in the same manner as in Example 13 except that the DL-malic acid was replaced with citric acid. The CMP was tested in the same manner as in Example 1. As the result, the CMP rate was as high as 213 nm/minute but the etching rate was at a little inferior level of 4.6 nm/minute. Also, the same substrate having the groove pattern formed therein as that of Example 13 was polished by CMP in excess for the time corresponding to 30% and thereafter the substrate surface was observed, where the dishing was in a depth of about 150 nm or less, and neither erosion nor polish scratch was seen to have occurred.

Comparative Example 6

A polishing solution for metal was prepared in the same manner as in Example 13 except that the ammonium polyacrylate was not added. The CMP was tested in the same manner as in Example 1. As the result, the CMP rate was at only a little inferior level of 140 nm/minute, but the etching rate was as inferior as 10.3 nm/minute. Also, the same substrate having the groove pattern formed therein as that of Example 13 was polished by CMP in excess for the time corresponding to 30% and thereafter the substrate surface was observed, where the dishing was in a large depth of about 300 nm. Erosion and polish scratch were not observable.

Comparative Example 7

A polishing solution for metal was prepared in the same manner as in Example 13 except that the ammonium polyacrylate was not added and the benzotriazole, added in an amount of 0.1 part by weight, was added in a larger amount of 0.2 part by weight. Using this polishing solution, the CMP was tested in the same manner as in Example 1.

As the result, the etching rate was as good as 2.4 nm/minute, but the CMP rate was as inferior as 93 nm/minute. Also, the same substrate having the groove pattern formed therein as that of Example 13 was polished by CMP in excess for the time corresponding to 30% and thereafter the substrate surface was observed. As the result, the dishing was in a depth of about 150 nm, a value not well satisfiable. This was presumably because, although the etching rate was low, the CMP rate was also so low that it took a long time for the CMP. Erosion and polish scratch were seen not to have occurred.

As can be seen from these Examples and Comparative Examples, the effect of controlling the etching rate to 10 nm/minute or less by adding only the first protective-film forming agent in a stated concentration can be achieved by using the second protective-film forming agent in combination, even when the first protective-film forming agent is used in a lower concentration, also showing the effect of maintaining a higher CMP rate. This makes it possible to keep the dishing, erosion and polish scratches from occurring and also to form highly reliable buried patterns at a high CMP rate.

POSSIBILITY OF INDUSTRIAL APPLICATION

As described above, according to the present invention, the etching rate can be made sufficiently low, and highly reliable buried patterns can be formed maintaining a high CMP rate.

What is claimed is:

1. A polishing method, comprising:
polishing a metal film, formed on a surface of an object to be polished, with a polishing pad, to remove at least part of the metal film, in a polishing solution which comprises:
oxidizing agent;
oxidized-metal dissolving agent;
at least one first material selected from the group consisting of benzotriazole and a derivative thereof, the at least one first material being a protective film-forming agent;
at least one second material selected from the group consisting of polyacrylic acids, polymethacrylic acids, polyamic acids, ammonium polyacrylates, ammonium polymethacrylates, and ammonium polyamides, wherein said at least one second material includes at least one of (a) at least one polyamic acid and (b) at least one ammonium polyamide; and
water,
wherein said at least one first material is included in the polishing solution in an amount of from 0.0001 mol to 0.05 mol, based on 100 g of the oxidizing agent, the oxidized-metal dissolving agent, the first and second materials and water, and
wherein said at least one second material is included in said polishing solution in an amount of 0.001% to 0.3% by weight, based on 100 g of the oxidizing agent, the oxidized-metal dissolving agent, the first and second materials and water.

2. The polishing method according to claim 1, wherein said oxidizing agent is at least one selected from the group consisting of hydrogen peroxide, nitric acid, potassium periodate, hypochlorous acid and ozone water.

3. The polishing method according to claim 1, wherein said oxidized-metal dissolving agent is at least one selected from the group consisting of an organic acid, an ammonium salt of an organic acid, and sulfuric acid.

4. The polishing method according to claim 1, wherein said oxidized-metal dissolving agent is at least one selected from the group consisting of malic acid, tartaric acid, citric acid, ammonium maleate, ammonium tartrate and ammonium citrate.

5. The polishing method according to claim 1, wherein the first material includes benzotriazole.

6. The polishing method according to claim 1, wherein said amount of said at least one second material is 0.003% to 0.1% by weight, based on 100 g of the oxidizing agent, the oxidized-metal dissolving agent, the first and second materials and water.

7. The polishing method according to claim 1, wherein said amount of said at least one second material is 0.01% to 0.08% by weight, based on 100 g of the oxidizing agent, the oxidized-metal dissolving agent, the first and second materials and water.

8. A polishing method comprising:
polishing a metal film, formed on a surface of an object to be polished, with a polishing pad, to remove at least part of the metal film, in a polishing solution which comprises:
oxidizing agent;
oxidized-metal dissolving agent;
at least one first material selected from the group consisting of benzotriazole and a derivative thereof, the at least one first material being a protective film-forming agent;
at least one second material selected from the group consisting of polyacrylic acids, polymethacrylic acids, polyamic acids, ammonium polyacrylates, ammonium polymethacrylates, and ammonium polyamides, wherein said at least one second material includes at least one polyamic acid; and
water,
wherein said at least one first material is included in the polishing solution in an amount of from 0.0001 mol to 0.05 mol, based on 100 g of the oxidizing agent, the oxidized-metal dissolving agent, the first and second materials and water, and
wherein said at least one second material is included in said polishing solution in an amount of 0.001% to 0.3% by weight, based on 100 g of the oxidizing agent, the oxidized-metal dissolving agent, the first and second materials and water.

9. A polishing method comprising:
polishing a metal film, formed on a surface of an object to be polished, with a polishing pad, to remove at least part of the metal film, in a polishing solution which comprises:
oxidizing agent;
oxidized-metal dissolving agent;
at least one first material selected from the group consisting of benzotriazole and a derivative thereof, the at least one first material being a protective film-forming agent;
at least one second material selected from the group consisting of polyacrylic acids, polymethacrylic acids, polyamic acids, ammonium polyacrylates, ammonium polymethacrylates, and ammonium polyamides, wherein said at least one second material includes at least one ammonium polyimide; and
water,
wherein said at least one first material is included in the polishing solution in an amount of from 0.0001 mol to 0.05 mol, based on 100 g of the oxidizing agent, the oxidized-metal dissolving agent, the first and second materials and water, and wherein said at least one second material is included in said polishing solution in an amount of 0.001% to 0.3% by weight, based on 100 g of the oxidizing agent, the oxidized-metal dissolving agent, the first and second materials and water.

10. The polishing method according to claim 1, wherein said polishing is performed by applying chemical mechanical polishing.

11. The polishing method according to claim 1, wherein said metal film contains any one selected from the group consisting of copper, a copper alloy, a copper oxide and a copper alloy oxide.

12. The polishing method according to claim 1, wherein said object to be polished has a multi-layer film including a metal layer containing any one selected from the group consisting of copper, a copper alloy, a copper oxide and a copper alloy oxide, and wherein at least part of the metal layer is removed from the multi-layer film by the polishing.

13. The polishing method according to claim 1, wherein said polishing solution has the property that it chemically mechanically polishes said metal film even when said polishing solution is free of abrasive particles.

14. The polishing method according to claim 1, wherein the polishing pad has a softness greater than a softness of abrasive particles for polishing a metal film.

15. The polishing method according to claim 1, wherein a combination of the first and second materials has a property that it can control etching of the metal film without having films thereof function as a metal surface protective film against friction by the polishing pad.

* * * * *